Feb. 28, 1967 J. M. BENTLEY 3,307,046

COUNTER EMPLOYING TUNNEL-DIODE MONOSTABLE CIRCUIT DRIVING TUNNEL-DIODE BISTABLE CIRCUIT FOR EACH STAGE

Filed March 11, 1964

WITNESSES:

INVENTOR
John M. Bentley
BY
ATTORNEY

United States Patent Office 3,307,046

Patented Feb. 28, 1967

3,307,046

COUNTER EMPLOYING TUNNEL-DIODE MONOSTABLE CIRCUIT DRIVING TUNNEL-DIODE BISTABLE CIRCUIT FOR EACH STAGE

John M. Bentley, Glen Burnie, Md., assignor to Westinghouse Electric Corporation, Pittsburgh, Pa., a corporation of Pennsylvania Filed Mar. 11, 1964, Ser. No. 350,986

7 Claims. (Cl. 307—88.5)

This invention relates to improvements in electronic counters. More specifically, the invention relates to novel and improved counter utilizing devices having a nonlinear current-voltage characteristic with two positive differential impedance regions separated by an intermediate negative differential impedance region. Tunnel diodes are preferred examples of such devices for carrying out the objectives of the present invention. Any device having an I–V characteristic equivalent to that of a tunnel diode may be utilized although as the description proceeds, it will be seen that certain of the devices need only one positive impedance region separated from the negative impedance region by a peak current breakover point.

Although it is contemplated that any appropriate device having I–V characteristics adapted to carrying out the present inventive concept may be used, the illustrative embodiment of the present invention utilizes negative impedance diodes known in the art as "tunnel diodes." The words "tunnel diodes" are used herein to designate a type of semiconductor diode characterized by quantum mechanical tunneling of electrons in the manner described in the patent to Esaki, 3,033,714. Although this patent did not issue until May 8, 1962, the characteristics and mode of operation of these diodes were known to the art in 1958. These negative resistance, or tunnel diodes employ heavily doped semiconductor material to obtain a very thin junction and relies upon quantum mechanical tunneling of the electrons in traveling across a p-n junction at substantially the speed of light which occurs where an initial small forward bias is applied. A comparatively large forward current accordingly flows with an extremely small forward bias and this current decreases markedly when the bias is increased thereby producing the negative resistance region in the device characteristics. A further increase in bias results in an increase in current.

The characteristics of these negative resistance diodes are utilized in the bistable counter device and circuit as both the active counting and steering devices.

Accordingly, a primary object of the instant invention is to provide a new and improved solid state counter device.

Another object is to provide a new and improved counter having counter stages utilizing differential negative I–V characteristics.

Another object is to provide a new and improved counter device employing differential negative resistance semiconductor diodes.

Another object is to provide a novel solid state binary counter stage in which tunnel diodes are used as the active and steering elements.

A further object is to provide a new and improved counter in which each counter stage comprises a pair of tunnel diodes coupled in cascade, one diode being normally biased for monostable multivibrator operation and the other being biased for bistable multivibrator operation.

These and other objects will become more clearly apparent after the study of the following specification when read in connection with the accompanying drawings, in which.

Briefly, the present invention provides a novel counter in which all of the counter stages use negative differential resistance devices, such as tunnel diodes, each having a transfer characteristic with two positive resistance regions separated by a negative differential resistance region, used both as the active and the steering elements. Each stage of the counter comprises a pair of similar tunnel diodes, one of which is biased to operate as a monostable multivibrator in response to positive input pulses and the other is biased as a bistable multivibrator. For convenience, the first of each pair of diodes will be designated by the letter X with appropriate subscripts corresponding to its stage and the second diode of each pair will be designated by the letter Y and the appropriate subscript corresponding to its stage. All of the stages are connected in cascade so that an input pulse applied to the first device passes into and is stored in the first stage, a second pulse passes through the first stage into the second stage and is stored in the latter, the third pulse passes through the first and second stages into the third stage where it is stored, etc. The tunnel diodes of each section of the stages and each of the stages are coupled through suitable capacitors constituting a coupling network between the stages and the diodes of each stage. The values of the voltage amplitude and the associated dropping resistors are so chosen as to provide load lines for the respective diodes having the appropriate position and slope to provide the two respective types of operation in the diodes. The adjustment of the two respective types of diodes is such that the load lines of the first of each pair are positioned between zero and peak current and are sloped so that the load lines intersect the characteristic curve at only one point just below the peak current and crosses the abscissa substantially below the valley current point. On the other hand, the load lines of the other diodes are positioned and sloped so that they intersect the first positive portion of the curve just below the peak current point, and intersect the negative portion about midway between the peak current and the valley current points and again at the valley current point. These load line settings for the X diodes represent the set condition, and the two load line settings for the Y diodes represent the set and reset conditions respectively, for the Y diodes.

Figure 1:
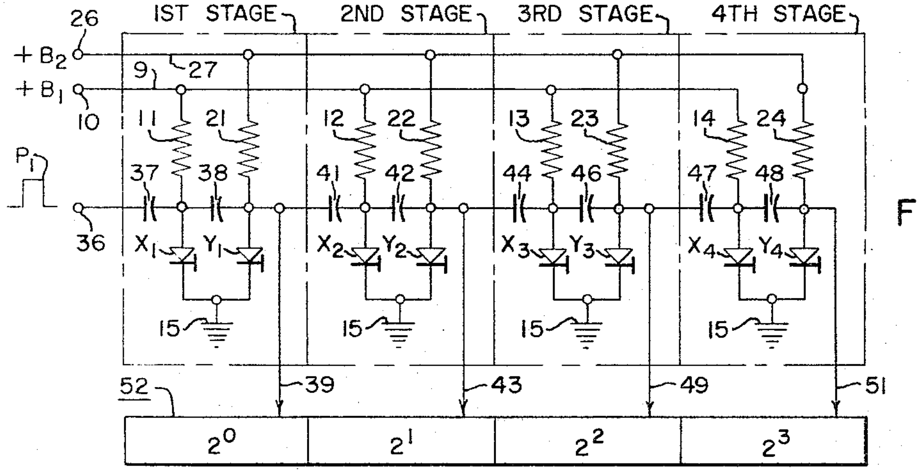
FIGURE 1 is a circuit diagram of an embodiment of the present invention.
Figure 2:
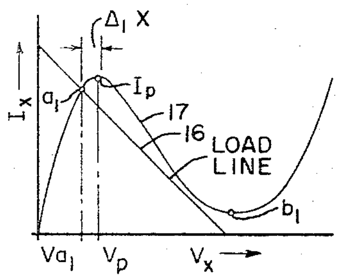
FIG. 2 is a graph of the voltage-current characteristic curve of the negative resistance diodes of FIG. 1 showing the selection of operating points to utilize the diode as a monostable multivibrator.

In the embodiment of the invention illustrated in FIG. 1, a number of pairs of similar differential negative resistance semiconductor diodes are connected into a circuit configuration constituting a counter. Four pairs of diodes are shown but more pairs may be included in the counter if desired. Each pair between the dotted lines for example $X_1$, $Y_1$, constitutes a counter stage. All of the X diodes are connected to a source of potential $B_1$, not shown, but represented by the terminal 10, through lead 9 and identical resistors 11, 12, 13 and 14. The anodes of the X diodes, represented by the arrowheads, are connected to the respective resistors while the cathodes of these diodes are connected to ground 15. The value of the D.C. potential $B_1$ represented by the terminal 10, is properly related to the values of the respective resistors for the X diodes so that the load line for the X diodes is as represented in FIG. 2 where the load line 16 intersects the first positive portion of the I–V characteristic curve 17 for the diode just below the peak current at point $a_1$ on the curve and the load line is tilted so that it is substantially parallel to the negative portion of the curve 17, not touching it but intersecting the abscissa at a point substantially below the valley current point, $b_1$. Any positive pulse slightly greater than the value $\Delta_1X$ will cause the X diodes to be driven across their peak current points into the negative portion of the curve 17. Then, when the positive pulse returns to zero, the X diodes will return to their original condition, which will be called the set condition represented at the point $a_1$ where the load line 16 intersects the chacteristic curve 17.

Figure 3:
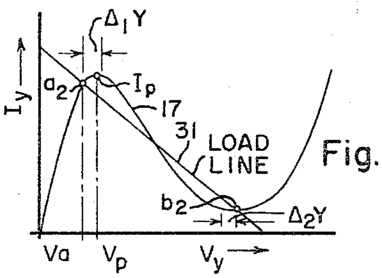
FIG. 3 is a graph of the voltage current characteristic curve of the negative resistance diodes of FIG. 1 showing the choice of operating points to permit the diode to be operated as a bistable multivibrator.

All of the Y diodes are connected through suitable resistors 21, 22, 23 and 24, respectively, to a source of direct current potential $B_2$, represented by the terminal 26, by means of a suitable lead 27. The value of the D.C. potential $B_2$ is so related to the value of the respective anode resistors for the Y diodes as to cause all of the Y diodes to have a load line 31 related to their characteristic curve 17 as illustrated in the I–V curve of FIG. 3. It will be apparent that the potential $B_2$ on the terminal 26 is somewhat greater than the potential $B_1$ on terminal 10 while the value of the respective resistors for the Y diodes is slightly less than those for the X diodes so that the load line 31 has a smaller negative slope than the load line 16 for the X diodes. It will be noted that the load line 31 intersects the first positive portion of the curve 17 at point $a_2$, which is just slightly below the peak current point $I_p$ of curve 17 by an amount $\Delta_1Y$, which is slightly less than the increment voltage $\Delta_1X$, representing the amount that the voltage $Va_1$, corresponding to point $a_1$ in FIG. 2 is below the voltage, $V_p$, corresponding to the peak current point $I_p$. The load line 31 of FIG. 3, intersects the curve 17 about midway between the peak and valley current points and again at the valley current point $b_2$. As in the case of the X diodes, the position of the load line 31 represents the normal operating condition of the Y diodes, in this case the reset condition. It will be readily apparent that with the Y diodes connected in circuits having load lines 31 positioned, as indicated in FIG. 3, they will be capable of bistable operation upon the application of pulses of alternate opposite polarities. For example, if a positive pulse slightly greater than the value $\Delta_1Y$ is applied to the Y diodes it does not affect the state of the Y diodes; it merely increases the current flow beyond point $b_2$. A negative-going pulse greater than $\Delta_2Y$ applied to the Y diodes drives the latter to their reset condition represented at point $a_2$.

The input terminal for positive pulses to be counted is indicated at 36. A series of capacitors, enumerated immediately hereinafter, constitutes a coupling network between the stages and between the two sides of the stages. This terminal is coupled to the lower end of resistor 11 and the anode of the first diode $X_1$ by means of capacitor 37. The output of diode $X_1$ is coupled to the associated bistable multivibrator diode $Y_1$ of the first stage through the coupling capacitor 38. The output from the anode of the diode $Y_1$ constitutes the output of counter stage 1 and this is supplied over lead 39 to a suitable utilization device 52 which may be a count indicator or a ramp function generator ladder network of conventional construction. As will be seen from the subsequent description, the outputs of the other stages are also connected to this utilization device and their conjoint action may be utilized to generate a ramp function reference voltage or to indicate a binary count.

The output of stage 1 of the counter is coupled to the input of the second stage by means of capacitor 41 and the anode of diode $X_2$ is coupled by means of a cacapitor 42 to the anode of the diode $Y_2$. The output of the second stage, that is, the output from the anode of the diode $Y_2$ is connected by connection 43 to the utilization device 52. In like manner, coupling capacitors 44, 46, 47 and 48 couple the diodes of the respective stages and couple the respective stages themselves. Also, the output of stage 3 is connected by connection 49 to the utilization device 52 while the output of the last stage is connected by connection 51 to the utilization device 52.

It will be readily apparent that since the input signal is supplied to the terminal 36, the first counter stage, comprising diodes $X_1$ and $Y_1$, represents the least significant digit since the counter counts from left to right as viewed in FIG. 1.

In the operation of the present invention, the X diodes operate as monostable multivibrators while the Y diodes operate as bistable multivibrators. As previously mentioned, the values of the voltage supplies $B_1$ and $B_2$ and the respective resistors associated with the X diodes and those resistors respectively associated with the Y diodes are so chosen as to obtain the operating points, as indicated in FIG. 2 for the X diodes and as indicated in FIG. 3 for the Y diodes. The operating point $a_1$, FIG. 2, for the X diodes constitutes the set position for these diodes while the operating point $b_2$, FIG. 3, represents the reset state for all of the Y diodes. These represent the starting points for the diodes.

When positive pulses to be counted, such as those represented by the positive pulse $P_1$ are impressed upon the input terminal 36, assuming the amplitude of the pulses are slightly greater than the value $\Delta_1X$, as indicated in FIG. 2, the $X_1$ diode swings over the peak current point $I_p$, through the negative resistance region, between point $I_p$ and point $b_1$, until the current-voltage relationships for the tunnel diode $X_1$, the load resistor 11 and the power supply $B_1$ are no longer compatable. At this point diode $X_1$ returns to its steady state position at point $a_1$. This occurs in an extremely short time interval, as indicated by the monostable switching cycle output curve $CX_1$ for the $X_1$ diode in FIG. 4.

Figure 4:
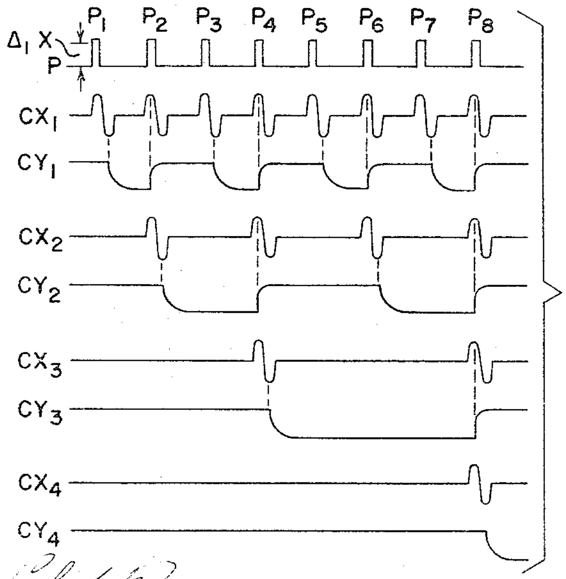
FIG. 4 is a series of graphs illustrating the operation of the present invention.

As previously indicated, the Y diodes can be shifted from their steady state reset position $b_2$ to set position $a_2$ by a negative pulse greater in amplitude than $\Delta_2Y$. The first pulse $P_1$ of the series of pulses indicated in the curve P of FIG. 4, applied to the diode $X_1$ causes its output to swing positive toward point $b_1$. This is represented by the first positive loop of the curve $CX_1$ of FIG. 4. This positive voltage pulse, supplied through the capacitor 38 to the anode of the diode $Y_1$ does not affect the state of $Y_1$ since it is already in its stable reset state at point $b_2$; it merely causes the current flow through diode $Y_1$ to increase beyond the point $b_2$. This is indicated by the straight horizontal portions of curve $CX_1$ of FIG. 4. On the return of the swing of the diode $X_1$ to point $a_1$ a negative-going excursion, the first negative loop of curve $CX_1$ of FIG. 4, is supplied to the anode of diode $Y_1$ through the capacitor 38. This negative-going pulse, being greater than the amplitude of pulse $\Delta_2Y$, forces the operating point of diode $Y_1$ in the direction of point $a_2$ and outside of the stable region around point $b_2$. The operating point of diode $Y_1$ then shifts to point $a_2$, FIG. 3. This negative swing cannot affect either diode $X_1$ or the monostable diode $X_2$ of the second stage of the counter since the most it can do is reduce somewhat the current flowing in the stable region of the two diodes $X_1$ and $X_2$. The X diodes therefore, act as buffers between the Y diodes. The output from the diode $Y_1$, now operating at point $a_2$, as indicated by the first negative loop of curve $CY_1$ of FIG. 4, will be supplied to the utilization device 52 over the connection 39.

The second positive pulse $P_2$ applied to the diode X again swings its operating point through its monostable excursion and through capacitor 38 supplies a positive pulse to diode $Y_1$ so that the latter is driven to its reset position $b_2$ represented by the second horizontal part of curve $CY_1$ of FIG. 4. During the change of state of diode $Y_1$ from point $a_2$ to point $b_2$ the monostable cycle of diode $X_1$ is therefore completed and hence the operating point of diode $Y_1$ never gets to point $b_2$ soon enough for the negative swing of diode $X_1$ to affect it on its cycle. Also, the remaining positive-going swing of diode $Y_1$ that occurs after diode $X_1$ has gone through its positive half-cycle does not affect the state of diode $X_1$ because of the fact that $X_1$ has already returned to its steady state. The positive-going signal fed back from the anode of diode $Y_1$ to the capacitor 38 is not sufficient to drive the diode $X_1$ above its steady state $a_1$.

The positive-going swing of the output of diode $Y_1$ is applied through the coupling condenser 41 to the diode $X_2$ of the second stage of the counter, which goes through its cycle and changes the state of diode $Y_2$ on its negative half-cycle exactly as in the manner of the operation of the first cycle described immediately above. The operation from this point on is a repetition of the previous cycles. This is graphically illustrated in the curves $CX_2$, $CY_2$, $CX_3$, $CY_3$, and $C_4Y_4$ of FIG. 4. It will be readily apparent that the outputs from the respective Y diodes are supplied to the utilization device 52 in a manner well understood in the art. The final count is illustrated in FIG. 4, the straight line in the last curve indicating that all of the stages except the last stage are in their reset positions, corresponding to 0 digits. These states will be indicated in the utilization device 52.

It will be readily apparent from the above that this invention provides a very simple counter in negative impedance triggering devices, such as tunnel diodes, are utilized. Furthermore, this counter utilizes only two such devices per counter stage. Obviously, the diodes and the various resistors and coupling capacitors constructed as separate and individual components may be used in this circuit. However, the circuit configuration and the components used therein lends itself quite readily to molecularization and, therefore, a unit using the dendrite as the basic semiconductor devices could be utilized.

It will be readily apparent to those skilled in the art that many variations can be made without departing from the spirit of this invention.

What is claimed is:

1. A digital counter comprising a plurality of nonlinear resistance devices operatively associated in pairs to form respective stages, each of said devices having a characteristic curve with two positive differential portions separated by a negative differential portion; means, including potential dropping resistors, for energizing said devices; symmetrical capacitive means for directly coupling said devices and said stages in cascade; the potential dropping resistors for the first and the alternate ones of said devices being so related to the power supply used to energize said devices and to the characteristics of said devices as to cause said first and alternate devices to operate as monostable multivibrators, said monostable multivibrators constituting the input sides for the respective stages, the potential dropping resistors for the even numbered devices being so related to the power supply and to the characteristics of said even numbered devices as to cause the latter to operate as bistable multivibrators, said monostable devices being poled so that a positive input pulse increases the voltage on the anodes in the forward direction.

2. A digital counter comprising a plurality of nonlinear resistance devices operatively associated in pairs to form respective stages, each of said devices having a characteristic curve with two positive differential portions separated by a negative differential portion; means, including potential dropping resistors, for energizing said devices; symmetrical capacitive means for directly coupling said devices and said stages in cascade; the potential dropping resistors for the first and the alternate ones of said devices being so related to the power supply used to energize said devices and to the characteristics of said devices as to cause said first and alternate devices to operate as monostable multivibrators, said monostable multivibrators constituting the input sides for the respective stages, the potential dropping resistors for the even numbered devices being so related to the power supply and to the characteristics of said even numbered devices as to cause the latter to operate as bistable multivibrators said monostable devices constituting the input sides for the respective stages, and utilization means operatively associated with said stages for indicating the count of said counter.

3. A counter having a plurality of counter stages, each stage comprising two tunnel diodes each having an I–V characteristic curve with two positive differential portions separated by a negative differential portion, means for energizing the first and the alternate ones of said diodes for monostable multivibration, means for energizing the other diodes for bistable operation, and symmetrical capacitive coupling means for coupling said tunnel diodes in cascade.

4. A counter having a plurality of counter stages, each stage comprising two tunnel diodes each having an I–V characteristic curve with two positive differential portions separated by a negative differential portion, means for energizing the first and the alternate ones of said diodes for monostable multivibration, means for energizing the other diodes for bistable operation, symmetrical capacitive coupling means for coupling said tunnel diodes in cascade, and utilization means operatively associated with the output of each of said stages.

5. A counter stage comprising two nonlinear resistive impedance devices having an I–V characteristic curve with two positive differential portions separated by a negative differential portion, means for energizing the first of said diodes for monostable multivibrator operation, means for energizing the other of said diodes for bistable operation and reciprocal capacitor means coupling the output of said first diode to the input of said second diode.

6. In combination in a counter or stepping register a plurality of pairs of tunnel diodes, the pairs of diodes being operatively associated to form respective stages, reciprocal capacitive means coupling said diodes in cascade, means including potential dropping resistors for each of said diodes through which said diodes are biased in the forward direction, the dropping resistors for the odd numbered diodes being so related to their power supply and to the characteristics of said odd numbered diodes as to cause the latter to operate as monostable multivibrators, the dropping resistors for the even numbered diodes being so related to their power supply and to the characteristics of the even numbered diodes as to cause the latter devices to operate as bistable multivibrators.

7. In combination in a counter or stepping register a plurality of pairs of tunnel diodes, the pairs of diodes being operatively associated to form respective stages, reciprocal capacitive means coupling said diodes in cascade, means including potential dropping resistors for each of said diodes through which said diodes are biased in the forward direction, the dropping resistors for the odd numbered diodes being so related to their power supply and to the characteristics of said odd numbered diodes as to cause the latter to operate as monostable multivibrators, the dropping resistors for the even numbered diodes being so related to their power supply and to the characteristics of the even numbered diodes as to cause the latter devices to operate as bistable multivibrators, said monostable multivibrator devices being on the input side of the respective stages, all of said devices being poled so that a positive pulse increases the voltage in the forward direction and utilization means operatively associated with the outputs of said stages for indicating the count of said counter.

(References on following page)

References Cited by the Examiner

UNITED STATES PATENTS

| | | | |
|---|---|---|---|
| 3,097,312 | 7/1963 | Miller | 307—88.5 |
| 3,121,176 | 2/1964 | Burns et al. | 307—88.5 |
| 3,133,206 | 5/1964 | Bergman et al. | 307—88.5 |
| 3,135,875 | 6/1964 | Leightner | 307—88.5 |
| 3,193,704 | 7/1965 | Chueh | 307—88.5 |

ARTHUR GAUSS, *Primary Examiner.*

J. HEYMAN, *Assistant Examiner.*